United States Patent

Dimmock et al.

(10) Patent No.: US 9,660,117 B1
(45) Date of Patent: May 23, 2017

(54) ENERGY SELECTIVE PHOTODETECTOR

(71) Applicant: Sharp Kabushiki Kaisha, Osaka (JP)

(72) Inventors: James Andrew Robert Dimmock, Oxford (GB); Matthias Kauer, Oxford (GB); Nicholas J. Ekins-Daukes, London (GB); Paul N. Stavrinou, London (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/269,168

(22) Filed: Sep. 19, 2016

(51) Int. Cl.
| | |
|---|---|
| H01L 31/00 | (2006.01) |
| H01L 31/0352 | (2006.01) |
| H01L 31/0232 | (2014.01) |
| H01L 31/108 | (2006.01) |
| H01L 31/0304 | (2006.01) |
| H01L 31/02 | (2006.01) |
| H01L 31/0216 | (2014.01) |

(52) U.S. Cl.
CPC ...... *H01L 31/035227* (2013.01); *H01L 31/02* (2013.01); *H01L 31/02161* (2013.01); *H01L 31/02327* (2013.01); *H01L 31/03046* (2013.01); *H01L 31/1085* (2013.01)

(58) Field of Classification Search
CPC ............... H01L 31/02; H01L 31/02161; H01L 31/02327; H01L 31/035227
USPC .................................... 136/255, 256; 257/98
See application file for complete search history.

(56) References Cited

U.S. PATENT DOCUMENTS

| | | | |
|---|---|---|---|
| 4,394,571 A | 7/1983 | Jurisson | |
| 5,685,919 A | 11/1997 | Saito et al. | |
| 8,536,781 B2 | 9/2013 | Lee et al. | |
| 8,975,618 B2 | 3/2015 | Dimmock et al. | |
| 9,293,612 B1 * | 3/2016 | De Lyon | H01L 31/11 |
| 2010/0123120 A1 * | 5/2010 | Mohseni | H01L 27/14643 257/21 |
| 2014/0166107 A1 * | 6/2014 | Lee | H01L 31/0322 136/260 |

FOREIGN PATENT DOCUMENTS

WO   WO 2011/112406   9/2011

* cited by examiner

*Primary Examiner* — David Vu
*Assistant Examiner* — Brandon Fox
(74) *Attorney, Agent, or Firm* — Renner, Otto, Boisselle & Sklar, LLP

(57) ABSTRACT

A semiconductor device has a layered structure. The semiconductor device includes a metallic layer of thickness 1-100 nm, with a thickness optimized to absorb light in a wavelength range of operation. The device further includes an adjacent semiconductor layer additionally adjacent to an ohmic electrical contact, wherein the interface between the metallic layer and the semiconductor layer is electrically rectifying and energy selective. The device further includes a reflective back surface positioned opposite to the semiconductor layer relative to incident light providing broadband reflection in the wavelength range of operation. The semiconductor layer includes a quantum well adjacent to the metallic layer, wherein the energy selectivity is provided by the quantum well allowing charge carrier tunneling from the metallic layer. The device further may include an additional anti-reflection dielectric layer deposited on the metallic layer that is configured to minimize reflection of light in the wavelength range of operation.

20 Claims, 13 Drawing Sheets

FIG. 1 [CONVENTIONAL]

FIG. 2 [CONVENTIONAL]

FIG. 3 [CONVENTIONAL]

FIG. 6
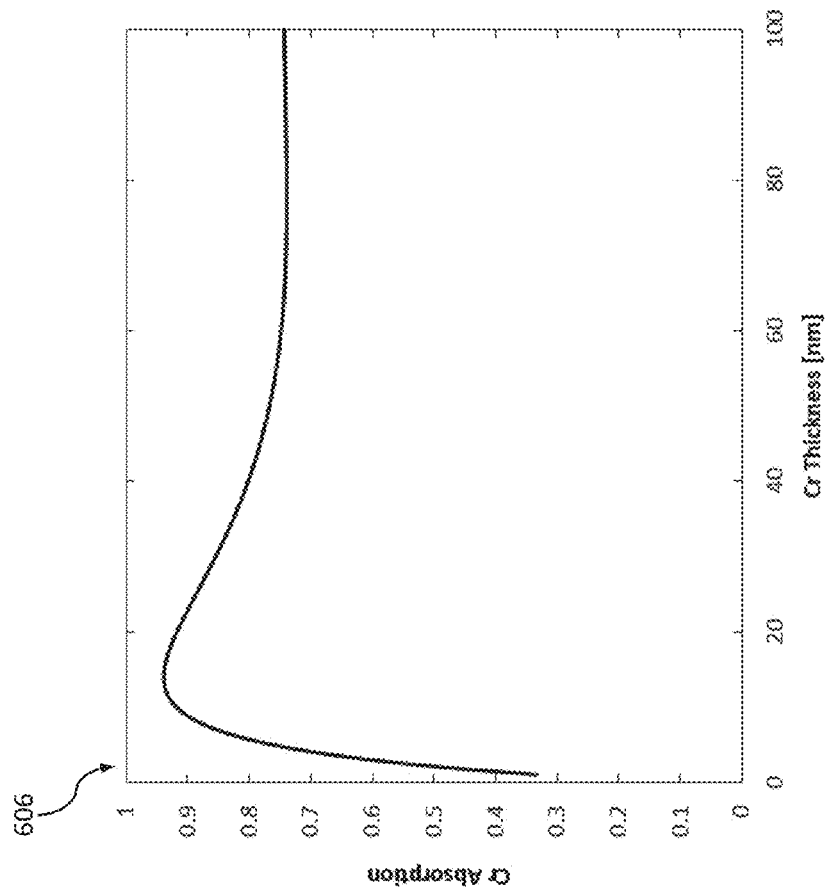
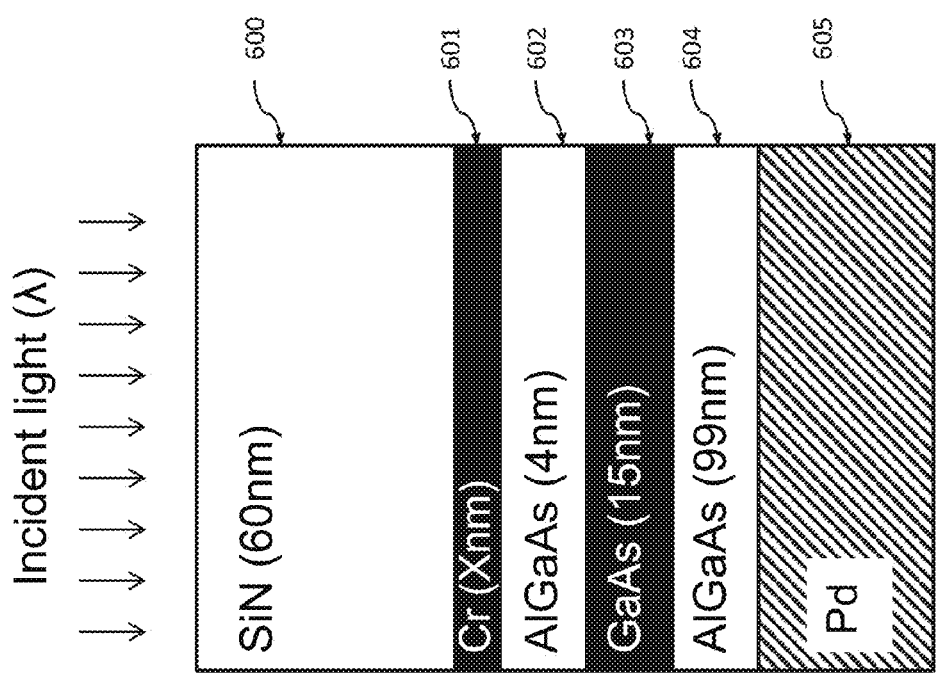

ENERGY SELECTIVE PHOTODETECTOR

TECHNICAL FIELD

The present invention relates to the conversion of solar energy into electricity and of the photodetection of light generally. In particular, the present invention relates to the absorption of light energy in a thin metallic layer and its conversion through irreversible energy selective extraction into an adjacent semiconductor region.

BACKGROUND ART

This invention is related to the field of infra-red Schottky barrier photodetectors, in which a metallic light absorbing layer is placed next to a semiconductor layer, forming an electrically rectifying junction which can be used to detect incident light. The present invention uses this technology in, and is also related to, the field of next generation photovoltaics in which the incoming light is efficiently converted into electrical energy.

The most conventional form of a Schottky barrier photodetector is shown in FIG. 1, consisting of a thin metallic film (101) adjacent to a semiconductor layer (102), with a reflective under layer (103) and an optional anti-reflective coating (ARC) layer (100). The operation of this class of devices relies on the photo-generation of ballistic carriers in the thin metal layer by an incident light beam (104), followed by irreversible extraction into the semiconductor layer prior to the electrons thermalizing in the metal layer. Therefore, to function, this device necessarily has a metallic layer that is thinner than the electron mean free path in the metal, such that the electrons are still ballistic when they reach the metal-semiconductor interface and are irreversibly extracted from the metallic layer to the semiconductor.

The thermalisation of electrons in a metal layer can be split into two stages, which are schematically illustrated in FIG. 2, showing the energy profiles of electrons in a metal at different times (200-202) following photoexcitation. Electrons are excited (203) to energies in excess of the fermi energy $E_f$ (205) by absorbing light, through Drude absorption, and initially create a profile (204). At this time (200) the electrons in the population (204) are ballistic and have not suffered any interaction events with either the lattice or other electrons. After a time of 0.1-1 ps (201) the electrons will have interacted with each other and the electron population in excess of the fermi energy (206) is described as hot, because the electrons have interacted with each other and so are thermalized amongst themselves, but have not interacted with the lattice and so still have a temperature in excess of the lattice temperature. The interaction with the lattice takes place on a timescale of 1-10 ps and results in an equilibrium electron distribution (202) which has the same temperature as the lattice. It is necessary to extract carriers before this time in order to have a successful photodetector or photovoltaic cell.

A schematic illustration of the operation of a conventional Schottky barrier photodetector is shown in FIG. 3. A metallic layer deposited on an n-doped semiconductor layer normally gives rise to a rectifying Schottky barrier in the conduction band (300) of the device. Illumination with light (301) warms the electron population (302) to an electron temperature (Te) which is in excess of the equilibrium lattice temperature. These hot carriers are able to irreversibly travel over the Schottky barrier (303) and generate a current in the device. This current is used to determine the intensity of light illuminating the device in a photodetector.

Early devices were based on thin films of metal which were so thin that they were partially transparent in order to ensure they were thinner than the mean free path of electrons in the metal. These devices were somewhat limited by low efficiency, and all related devices are specifically aimed at photodetection rather than photovoltaic conversion, as ballistic extraction results in the loss of low energy incident photons. This was somewhat improved in U.S. Pat. No. 4,394,571 (Jurisson, issued Jul. 19, 1983), with the introduction of a quarter wavelength cavity to enhance metallic absorption. However, the device still relied on immediate ballistic extraction of photoexcited carriers. Further improvements have focused on wave-guiding (WO 2011/112406, Patel et al., published Sep. 15, 2011), and improved absorption in metal layers has been shown through the use of resonant absorption (U.S. Pat. No. 8,536,781, Lee at al., issued Sep. 17, 2013) and plasmonic absorption (U.S. Pat. No. 5,685,919, Saito et al., issued Nov. 11, 1997).

In addition to prior art in infra-red photodetection, the present invention may be compared to hot carrier photovoltaic cells. Hot carrier photovoltaic cells operate by extracting carriers after they have thermalized among themselves, but before they have thermalized with the lattice (i.e. at stage (201) in FIG. 2). These devices have been the subject of investigation since then 1980s and one based on U.S. Pat. No. 8,975,618 (Dimmock et al., issued Mar. 10, 2015) has recently been realised. However, all such cells rely on absorption in a thin semiconductor layer and thus are limited in efficiency due to low total light absorption.

SUMMARY OF THE INVENTION

None of the background art has proposed a hot carrier photovoltaic cell using absorption in a metallic layer with extraction of electrons in such a device by any means other than through thermionic emission over a Schottky barrier. This invention proposes a new optoelectronic device structure to enhance the absorption of light in very thin (>30 nm) metal layers and extract photoexcited carriers from that metal region.

Conventional devices of this kind are commonly used in photodetection, which is often operated in forward bias (304) but can be used to generate power if operated in reverse bias (305) in a photovoltaic cell configuration. However, the low device efficiency means this device has not seen use in photovoltaics. The present invention provides an improvement to the device efficiency which could allow this device not only to operate as an efficient photodetector, but also as a photovoltaic cell.

The novel structure includes a thin metallic layer with an anti-reflective dielectric coating to air and a series of semiconductor layers with a highly reflective back coating beneath. The layer structure is tuned such that greater than 90% absorption of incident light between 400-1000 nm is possible in the thin metallic layer. This incident light absorption heats the electron population in the metal, which is then extracted into the semiconductor layers energy selectively.

Aspects of the invention include a semiconductor device having a layered structure. In exemplary embodiments, the semiconductor device may include a metallic layer of thickness 1-100 nm, with a thickness optimised to absorb light in a wavelength range of operation. The device further may include an adjacent semiconductor layer additionally adjacent to an ohmic electrical contact, wherein the interface between the metallic layer and the semiconductor layer is electrically rectifying and energy selective. The device further may include a reflective back surface positioned opposite to the semiconductor layer relative to incident light providing broadband reflection in the wavelength range of operation. The semiconductor layer may include a quantum well adjacent to the metallic layer, wherein the energy selectivity is provided by the quantum well allowing charge carrier tunneling from the metallic layer. The device further may include an additional anti-reflection dielectric layer deposited on the metallic layer that is configured to minimise reflection of light in the wavelength range of operation.

The advantages of a device in accordance with the present invention include the following:

The use of a metallic absorber; and

Energy selective extraction from the metallic absorber.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 6. shows a schematic representation of the layer structure of the proposed photovoltaic device with all contacts at the top and an optimised reflective back layer.

DETAILED DESCRIPTION OF THE INVENTION

Definition of Terms

Ballistic carrier: a charge carrier (electron or hole) that has not suffered a scattering event, with the associated change in energy and/or momentum. A photo-generated ballistic carrier preserves information about the photon that generated it, in the form of excess kinetic energy.

Hot carrier: a carrier whose kinetic energy is larger than the average equilibrium kinetic energy of the same type of carrier in a given material. Due to the relation between kinetic energy and temperature, a hot carrier is defined as a carrier in a population with a temperature higher than the lattice temperature. A carrier can suffer a number of scattering events and still be a hot carrier, but would not be ballistic.

Mean free path: the average length travelled by a carrier between scattering events. It is possible to assign different mean free paths to different scattering mechanisms.

Thermalisation: the process by which a carrier loses its excess energy. This process is generally the combined effect of several scattering mechanisms.

Technical Problem

In previously presented hot carrier photovoltaic cells in the prior art, absorption occurs through band-to-band absorption of light in a semiconductor Because the photo-generated carriers need to be extracted within a distance less than their mean free path, this necessitates very thin layers for the semiconductor absorbers. This results in low total light absorption (~1%) in these layers. In previously presented Schottky barrier infra-red photodetectors, photoexcited ballistic carriers are extracted when they have energy in excess of the Schottky barrier height. This results in low device efficiency as the energy held by carriers beneath the Schottky barrier height is lost.

Technical Solution

By absorbing light in a thin metallic film, the present invention enhances the absorption, as metallic films as thin as 8 nm can absorb over 99% of incident light over a broadband from 400-1000 nm as long as they have an appropriate refractive index, anti-reflective coating and phase matching layer to allow resonant light absorption in the thin metallic layer. This metallic absorption is currently used in Schottky barrier photodetectors, but in these devices large amounts of energy is wasted as the extraction of carriers does not occur energy selectively.

The present invention may include a semiconductor device in which light is first absorbed in a metallic layer, generating a hot carrier distribution. These photo-excited hot carriers are then extracted energy selectively. Any carriers which are not at the correct energy to be selectively extracted are redistributed in energy by carrier-carrier scattering, remain hotter than the lattice, and can still contribute to the overall efficiency of this device.

Figure 1:
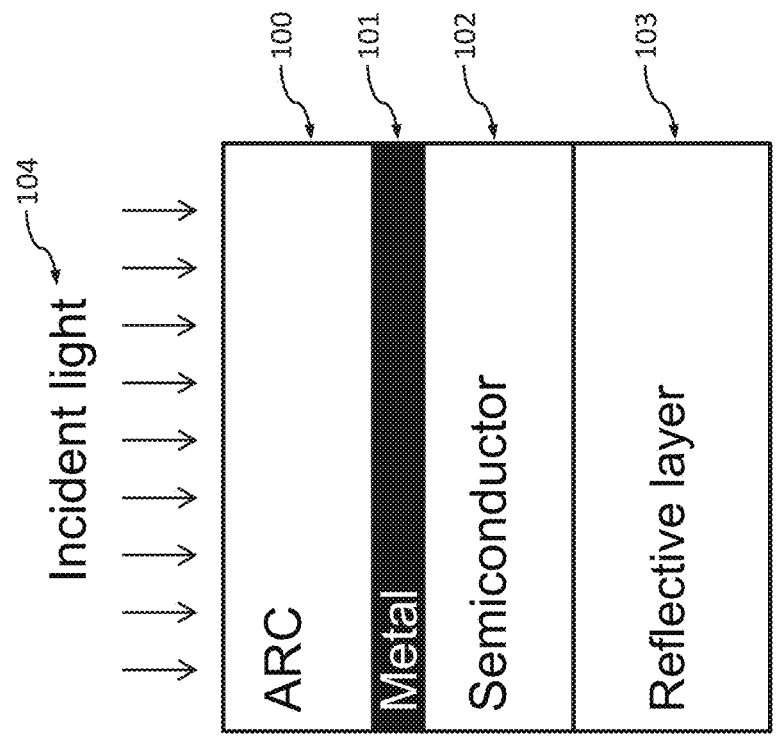
FIG. 1. shows a schematic representation of the layer structure of a conventional infra-red Schottky barrier photodetector.
Figure 2:
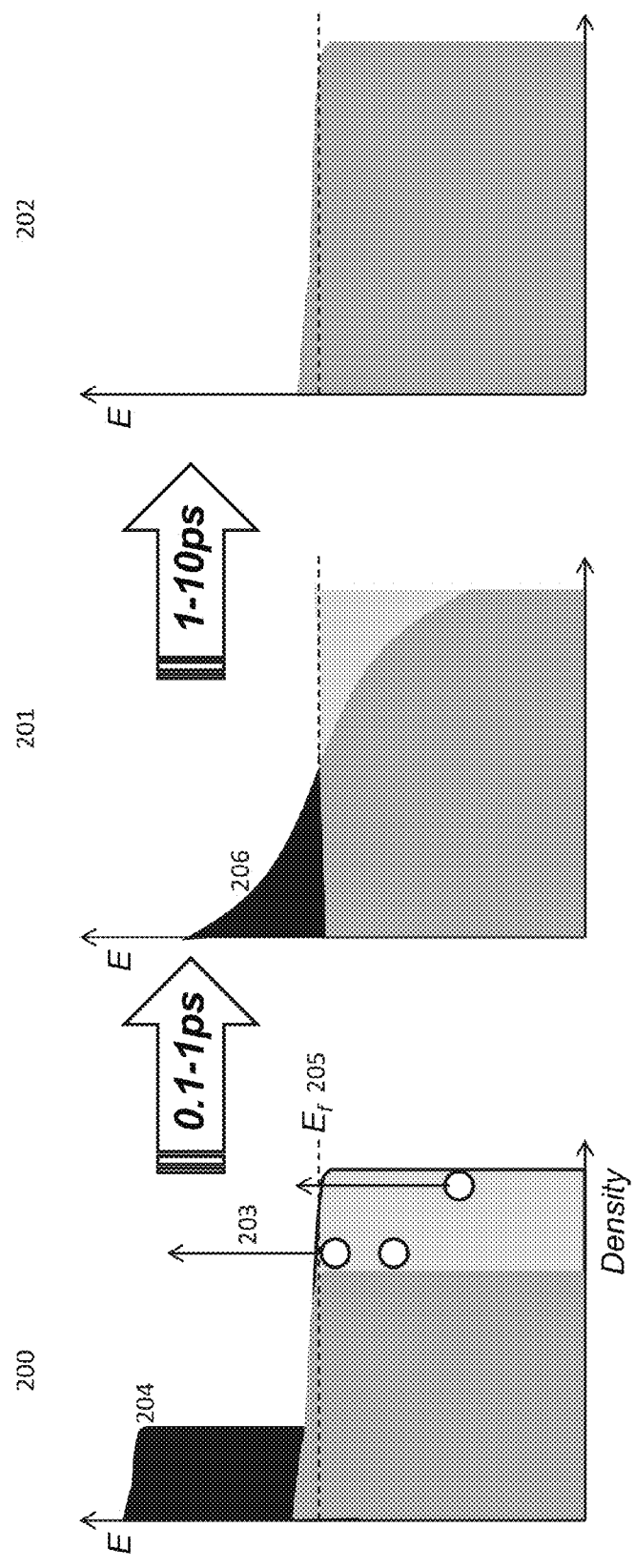
FIG. 2. shows a simplified illustration of the electron density profile at three times after a metal region is illuminated with light.
Figure 3:
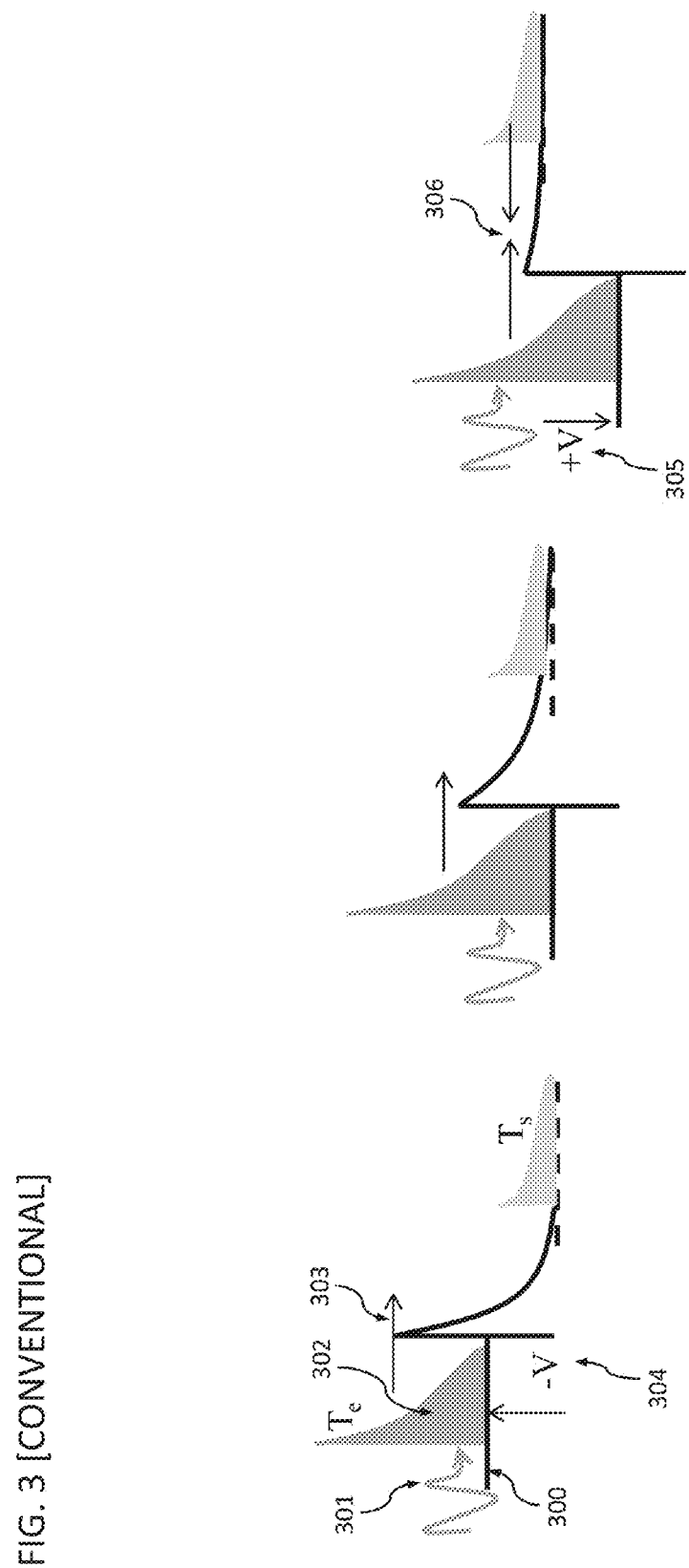
FIG. 3. shows a schematic representation of the conduction band of a Schottky barrier photodetector, how it extracts hot carriers and and how it responds to forward an reverse bias FIG. 4. shows a graph demonstrating how increased selectivity of extraction (decreased extraction energy width $\Delta E$) increases efficiency of a hot carrier photovoltaic cell. It then shows two examples of cells with low selectivity (standard Schottky barrier structure) and high selectivity (tunneling structure).
Figure 4:
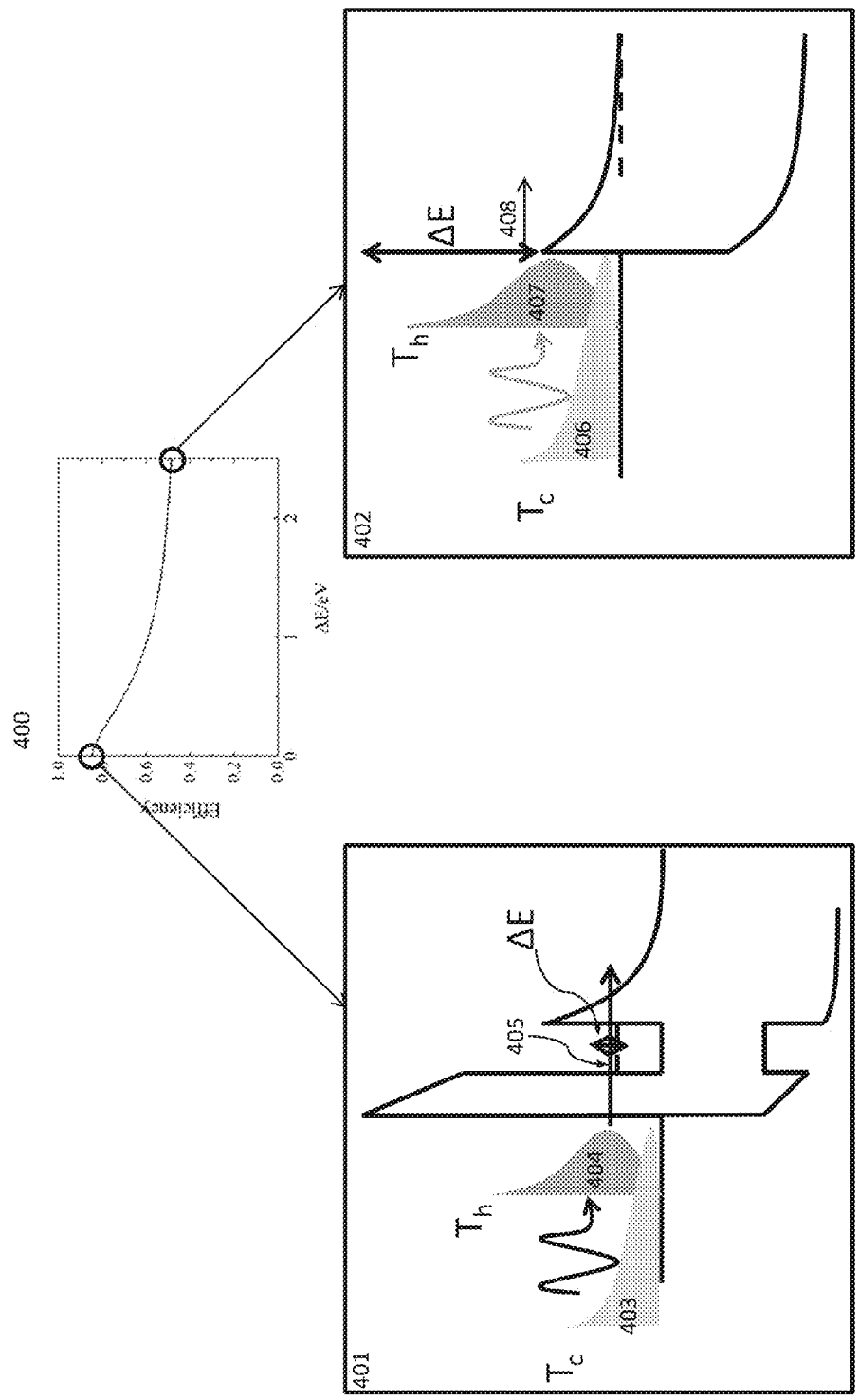

An example of such a device and its efficiency in comparison with a weakly selective, Schottky barrier, device is shown in FIG. 4. The selectivity is defined by a parameter ΔE, on the abscissa of graph (400). This parameter is defined as the energy width for which the probability of transmission from the metal to the semiconductor region is greater than 0.5. The ordinate axis of graph (400) has the efficiency of such a device, so that we can see how selectivity of extraction impacts device efficiency.

Redistribution of carrier energy in a weakly selective Schottky barrier cell (402) (i.e. extracting hot rather than ballistic carriers) increases the efficiency of such a device from the theoretical 10-20% maximum for a ballistic Schottky photodetector to 50-60% for a Schottky barrier device operating with hot carriers. This is due to recirculation of the energy of carriers which are not transmitted over the barrier. In reality this improvement is hard to achieve as it requires very fine tuning of the absorber thickness, to be thicker than the electron-electron mean free path but thinner than the electron-phonon mean free path, and no redistribution of energy from the higher energy carriers is possible as these are all transmitted.

By increasing the selectivity of the extraction (reducing ΔE) the efficiency of the device is increased to 85%, almost an order of magnitude higher efficiency than one might expect to achieve with a standard ballistic Schottky barrier photodetector. This ultra-selective extraction can be achieved, for example, by resonant tunneling of carriers from the metal through a double barrier quantum well, the device structure for which is schematically illustrated in 401. The semiconductor layers are necessarily n-doped in order to give the band bending required to produce a Schottky barrier, and they also have different conduction band energies in order to give rise to a quantum well region for extraction. The implementation of these is explored in more detail in various embodiments below.

In this device (401) light is absorbed in the metal layer and a cold population of electrons (403) is warmed to become a hot population (404), electrons from the hot population are then extracted energy selectively through a bound state in the quantum well (405) at the resonant tunneling energy for which the transmission probability of carriers from the metal to the semiconductor layers is substantially unity. For all other energies the transmission probability is very low and reflection of carriers at the metal/semiconductor interface occurs, followed by the carriers redistributing their energy (in particular providing further electrons at the resonant tunneling energy). This differs from the Schottky operation shown in (402) in which a cold distribution (406) is warmed to a hot distribution (407) and from which all carriers in excess of the Schottky barrier height can transfer (407) to the semiconductor layers.

In addition to improved device efficiency, extracting carriers through resonant tunneling at an energy lower than the Schottky barrier height gives the additional benefit that this device can operate at significantly longer wavelengths than in a traditional Schottky barrier photodetector. This is because with a traditional Schottky barrier photodetector it is necessary for electrons to be excited to energies in excess of the Schottky barrier. However, with tunneling extraction, excitation only to the tunneling energy is required, which will necessarily be lower than the Schottky barrier height.

More generally and in accordance with description already provided, technical features of the present invention include the following:

A thin metallic absorbing layer, thinner than the electron mean free path in the metal.
An n-doped semiconductor adjacent to the metallic layer to provide extraction of electrons from the metal.
Energy selective extraction of carriers.
A reflective back surface.
An additional ohmic contact to the semiconductor layer.

Furthermore, the present invention may include the following additional features:

Optimum thickness metallic layer.
Optimum thickness semiconductor to provide optical broadband resonance.
Selective extraction of carriers by resonant tunnelling.
An optimised conduction band offset.
Optimised Schottky barrier height between metal and semiconductor.
Reflective back surface provided by a thick metallic layer.
Reflective back surface provided by a Bragg reflector.

Aspects of the invention, therefore, include a semiconductor device having a layered structure. In exemplary embodiments, the semiconductor device may include a metallic layer of thickness 1-100 nm, with a thickness optimised to absorb light in a wavelength range of operation. The device further may include an adjacent semiconductor layer additionally adjacent to an ohmic electrical contact, wherein the interface between the metallic layer and the semiconductor layer is electrically rectifying and energy selective. The device further may include a reflective back surface positioned opposite to the semiconductor layer relative to incident light providing broadband reflection in the wavelength range of operation. The semiconductor layer may include a quantum well adjacent to the metallic layer, wherein the energy selectivity is provided by the quantum well allowing charge carrier tunneling from the metallic layer. The device further may include an additional anti-reflection dielectric layer deposited on the metallic layer that is configured to minimise reflection of light in the wavelength range of operation.

The semiconductor device described herewith may be physically implemented in numerous embodiments, detailed in the following section, but it is to be understood that there may be many other ways in which the device with the structure presented above may be built, and are implicitly incorporated in this disclosure.

Embodiment 1

Figure 5B:
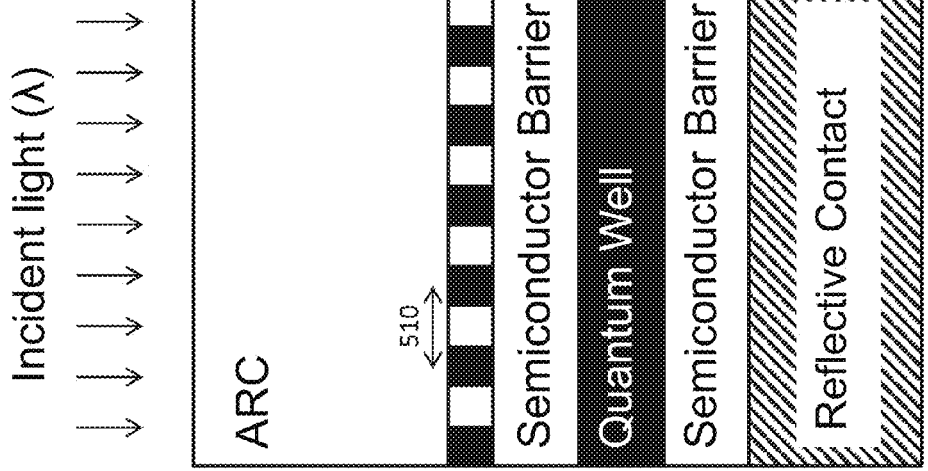
FIG. 5A and FIG. 5B. show a schematic representation of the layer structure of the proposed photovoltaic device.
Figure 5A:
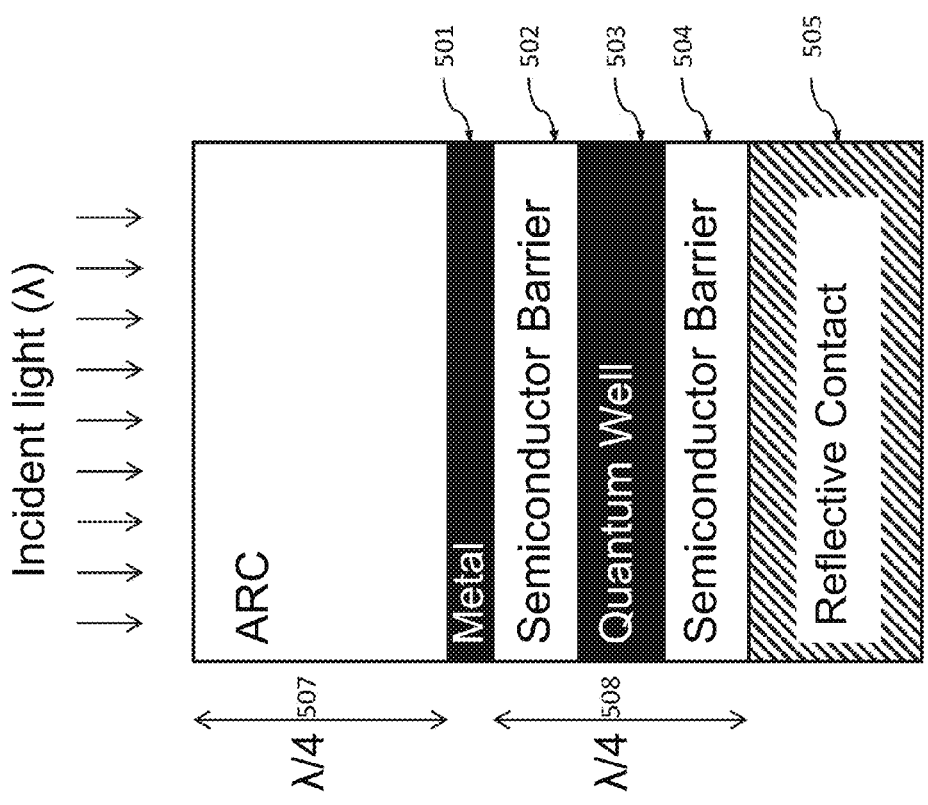

FIG. 5A presents a possible architecture of the energy selective metallic photovoltaic device. In this schematic a thin metallic layer (501) (thinner than the electron mean free path in the chosen metal) is disposed on a series of semiconductor layers, which will give the band structure as illustrated in FIG. 4 (401). The metallic layer (501) may have a thickness of 1-100 nm and may be optimized to absorb light in the wavelength range of operation. The semiconductor layers (502, 503, 504), which may include a quantum well layer (503) in between two semiconductor barrier layers (502) and (504) should be n-doped and the semiconductor barrier layers (502, 504) should have a conduction band which has a positive potential energy offset from the quantum well layer (503). This can be achieved, among other ways, by having the semiconductor barrier material being of a wider band gap energy than the semiconductor well layer. In this way a quantum well is formed inside a Schottky barrier, whereby transmission of carriers from the metallic layer (501) into the semiconductor barrier material (504) is only possible at discrete energies substantially equal to the bound state energies of the quantum well.

There are various exemplary configurations for different uses of the described device structure. For example, the semiconductor device may be configured to extract carriers against an external resistance so as to convert optical energy in to electrical energy. The semiconductor device further may be associated with an external bias voltage source that applies an external bias, wherein carriers are extracted with the assistance of the external bias so as to operate the semiconductor device as a photodetector.

Embodiment 2

In a further embodiment, the light absorption in the structure is enhanced so that light is resonantly absorbed in the thin metallic layer or layers. Resonant absorption is achieved when the thicknesses of the anti-reflective layer, metal layer and semiconductor layer (or layers) are optimised to ensure light reflecting off the metal absorber layer interferes destructively with light reflecting off the back surface reflector. In practice this can be achieved by choosing the layer thickness of the antireflective coating (507) and the series of semiconductor layers (508) prior to the reflective contact to be approximately equal to one quarter of the wavelength of light in these regions respectively. For a broadband source of light this value is taken as the central wavelength of light in a spectrum or computationally optimised.

In addition to this relationship for the anti-reflective coating layer and semiconductor layers, the thickness of the metal can also be optimised so that an equal amount of light is reflected from the metal layer (501) as is transmitted through it and will be reflected off the back surface reflector (505). In this way the destructive interference of light is optimised and the resonant absorption in the metal layer can be maximised.

A specific embodiment in Chromium and GaAs/AlGaAs showing optimum thicknesses required to achieve high absorption is shown in FIG. 6. In this structure each of the ARC layers (600) and semiconductor layers (602, 603,604) has been computationally optimised to achieve maximum absorption in the Cr layer (601), with a fixed thickness back reflector of Pd (605). The graph in FIG. 6 (606) shows the absorption as a function of Cr thickness, showing that optimum absorption over 90% is achieved for a Cr thickness of 15 nm and decreases for thicker layers. This thickness of 15 nm is also below the electron mean free path in Cr and so is an electrically and optically optimum thickness for this device.

Generally, therefore, a thickness of the anti-reflection layer and a thickness of the semiconductor layer may be optimised such that light reflecting off each of the anti-reflection layer and the semiconductor layer destructively interferes. In addition, the thickness of the antireflection layer and a thickness of the semiconductor layer may be substantially equal to one quarter of the wavelength of light in those layers. Furthermore, the metallic layer thickness may be optimised such that in the absence of any other layers the metallic layer would transmit 50% of the incident light in the wavelength range of operation. The thickness of the metallic layer also may be less than a mean free path of a photoexcited electron in the metallic layer in the wavelength range of operation.

In addition to this thickness optimisation of the metal and anti-reflection layers, there can also be structural optimisation to allow plasmonic absorption in the metal. This can be achieved, among many other ways, by creating a grating or prism structure to enhance the electric field perpendicular to the metal/semiconductor interface. Such a structure is schematically represented in FIG. 5B, in which the metal layer has a grating structure (509) to improve absorption. The distance between adjacent metallic features (510) of the grating can be optimised to allow strong absorption for particular wavelengths of illumination, but is not generally able to be optimised for broadband absorption, so only finds use in wavelength specific embodiments of this invention rather than broadband embodiments.

Embodiment 3

In a further embodiment of this device the metallic layer is chosen to have a both a refractive index and extinction coefficient of between 2 and 5, or more preferably between 3 and 4 over the wavelength range of interest. Choosing a metal with these properties acts to enhance Drude absorption and minimise the reflection of light from the metal surface.

A particular example of this is Chromium for the wavelength range of 400-1000 nm. Other metals which also have this property are Molybdenum, Bismuth and Cobalt, and this property could be achieved more widely (and tuneably) with suitable combinations of metallic layers in an alloy (e.g. a Nickel/Cobalt alloy).

Embodiment 4

Figure 7:
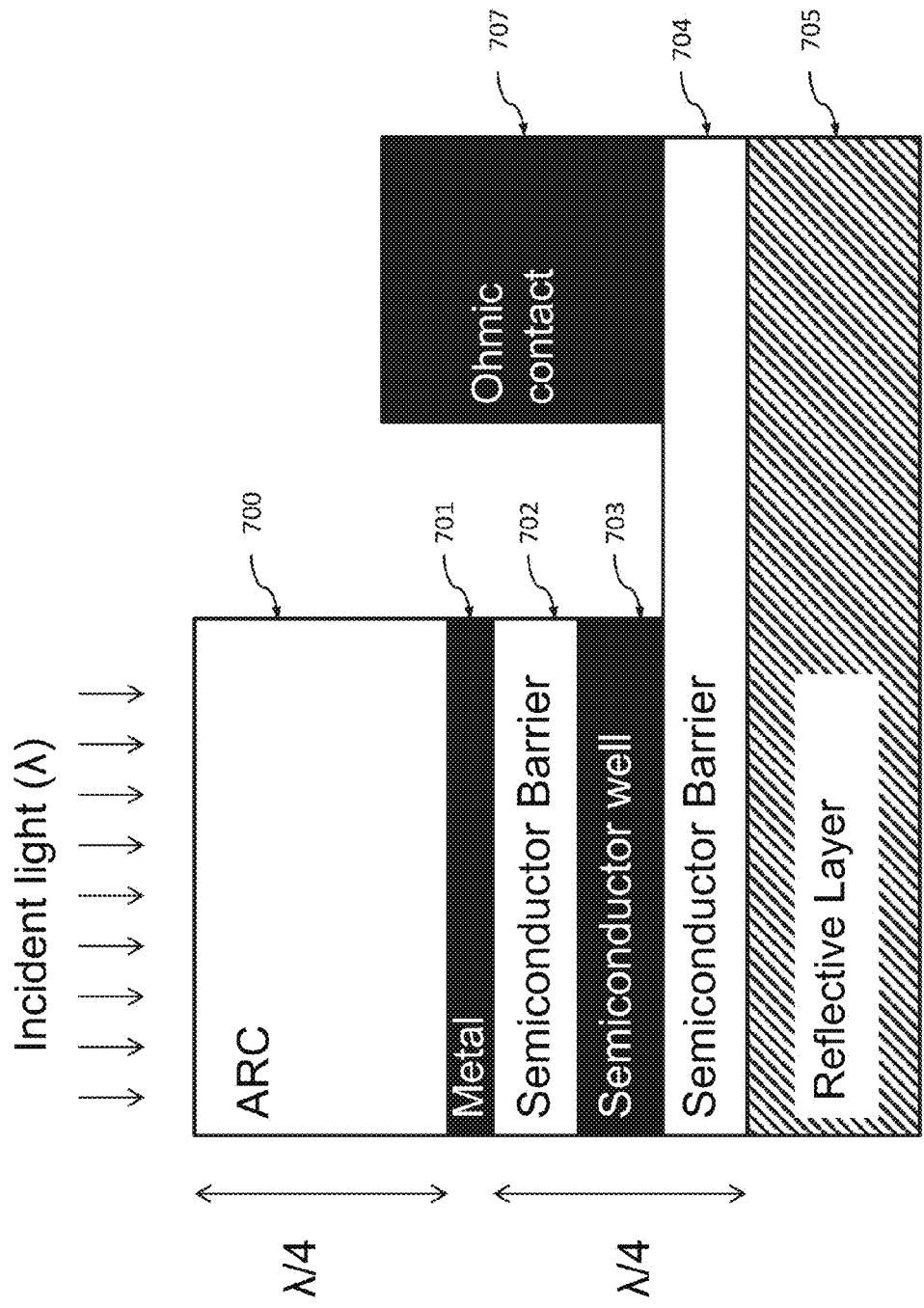
FIG. 7. shows a schematic representation of the device realised in nanowire or nanofins with an intervening matrix (706) to reduce the refractive index of the semiconductor layer.

In a further embodiment shown in FIG. 7, the device can be contacted entirely from the top, by etching down through antireflective coating layer (700), metal layer (701) semiconductor barrier layer (702) and semiconductor quantum well layer (703), which may have properties similar to previous embodiments, to the semiconductor barrier layer (704) and forming an ohmic contact (707) to the semiconductor layer from the top side. This allows full flexibility in choosing the back reflective layer (705) as it no longer needs to be an ohmic contact layer as well. In this case the reflective layer might be a particularly reflective metal, such as silver, or even a stack of semiconductor layers tuned to provide optimised reflection over a broad or narrow range of wavelengths or a (such as a distributed Bragg reflector (DBR)).

Embodiment 5

Figure 8:
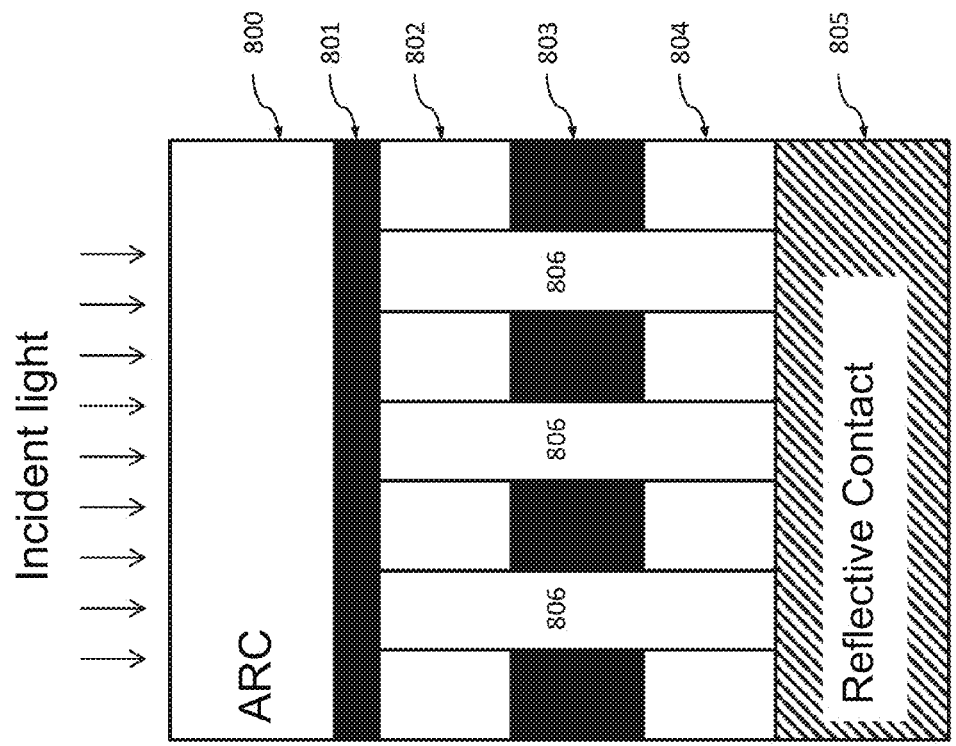
FIG. 8. shows a schematic representation of the conduction band of the proposed photovoltaic device realised in GaAs/AlGaAs before and after deposition of a Chromium layer.

In order to allow a thicker semiconductor series of layers, a nanowire or nanofin construction may be used as schematically illustrated in FIG. 8. Similar to previous embodiments, the embodiment of FIG. 8 may include an antireflective coating layer (800), metal layer (801) semiconductor barrier layer (802), semiconductor quantum well layer (803), another semiconductor 804, and a back reflective layer (805) which may have properties similar to previous embodiments In such an arrangement of FIG. 8 the semiconductor layer structure is grown or etched as a series of nanowires (one dimensional) or nanofins (two dimensional) with voids in between in a plane perpendicular to the direction of incident light. These voids (806) can be filled with a dielectric medium and allow a thicker semiconductor layer series, as the effective refractive index of this composite layer will be the weighted average of the semiconductor layers and the interleaving dielectric (806). This average refractive index can be lower than the refractive index of the semiconductor layer series, and therefore the optimised thickness of this composite layer, equal to one quarter of a wavelength of incident light in that material, can be thicker.

In addition to being thicker, having a different refractive index in these layers allows a refractive index change between semiconductor barrier layer (804) and the back reflective layer (805). This can allow layers (804) and (805) to be grown in the same materials and still provide a reflective interface.

Embodiment 6

A specific materials system of interest is GaAs/AlGaAs, owing to mature processing technologies and design capabilities available for such materials. The layer thicknesses required to provide optimum optical absorption have already been calculated for this materials system with a Cr cap in FIG. 6 However, the electronic properties of the semiconductor well can also be improved to allow improved extraction of electrons from the metal layer(s).

Figure 9:
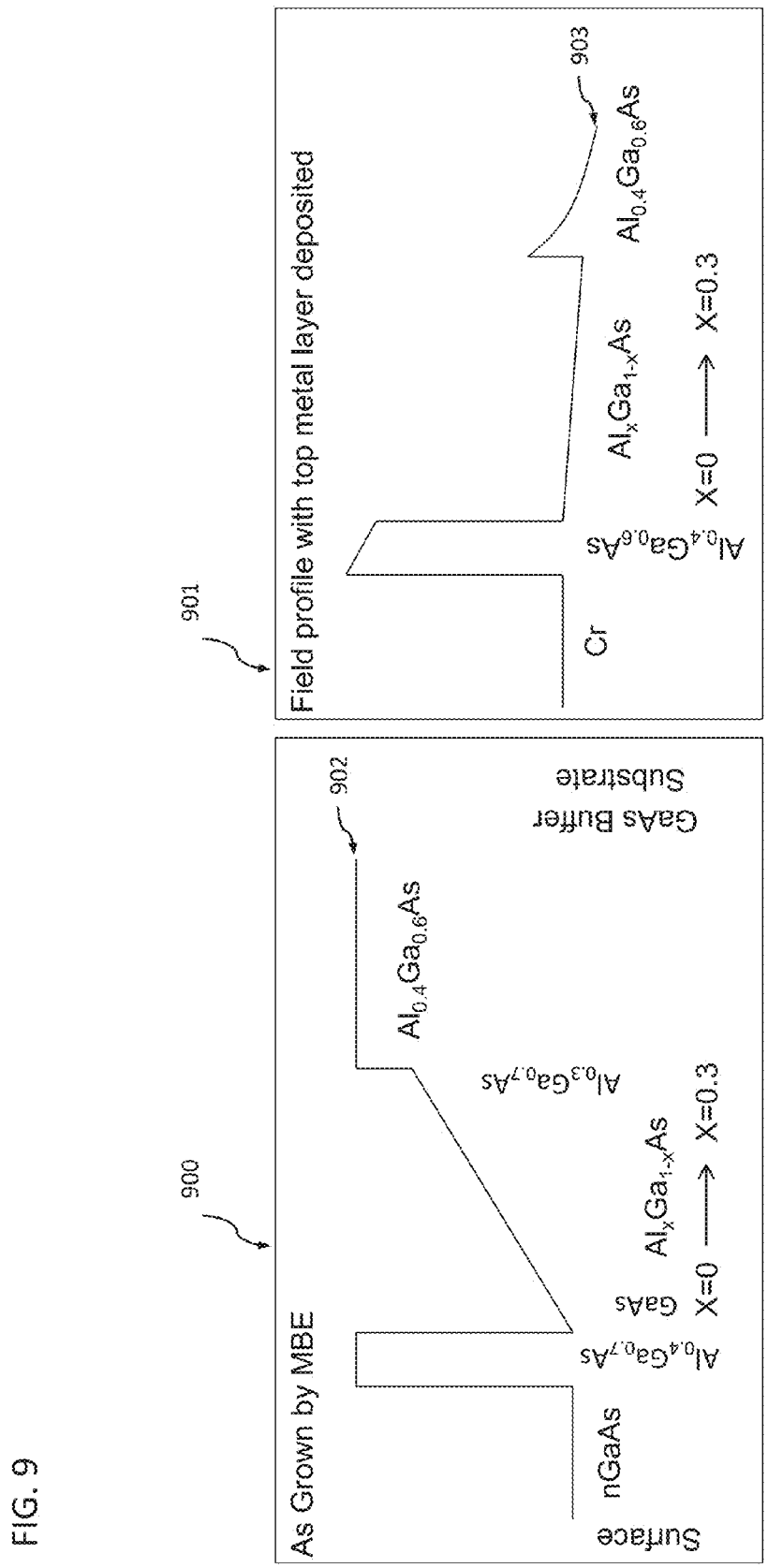
FIG. 9. shows experimental results of the current-voltage characteristic of the tunneling device in comparison with a Schottky device, showing an order of magnitude increase in current for the same illumination intensity (illumination at 785 nm).

A design for the semiconductor layer structure, shown as the conduction band profile (902) and (903), of such a device is shown in FIG. 9, respectively both before (900) and after (901) Chromium deposition.

The device in the example of FIG. 9 has a 4 nm $Al_{0.4}Ga_{0.6}As$ barrier, followed by a 15 nm graded $Al_xGa_{1-x}As$ well (with x=0 at the metal side and x=0.3 at the rear side), followed by a 100 nm layer of $Al_{0.4}Ga_{0.6}As$. All these layers are doped to $5\times10^{17}$ to give a Schottky barrier when a Chromium layer of 22 nm is deposited. The well is graded so that the conduction band structure is substantially flat when electrons are extracted, allowing better extraction than with a pure GaAs well.

Figure 10:
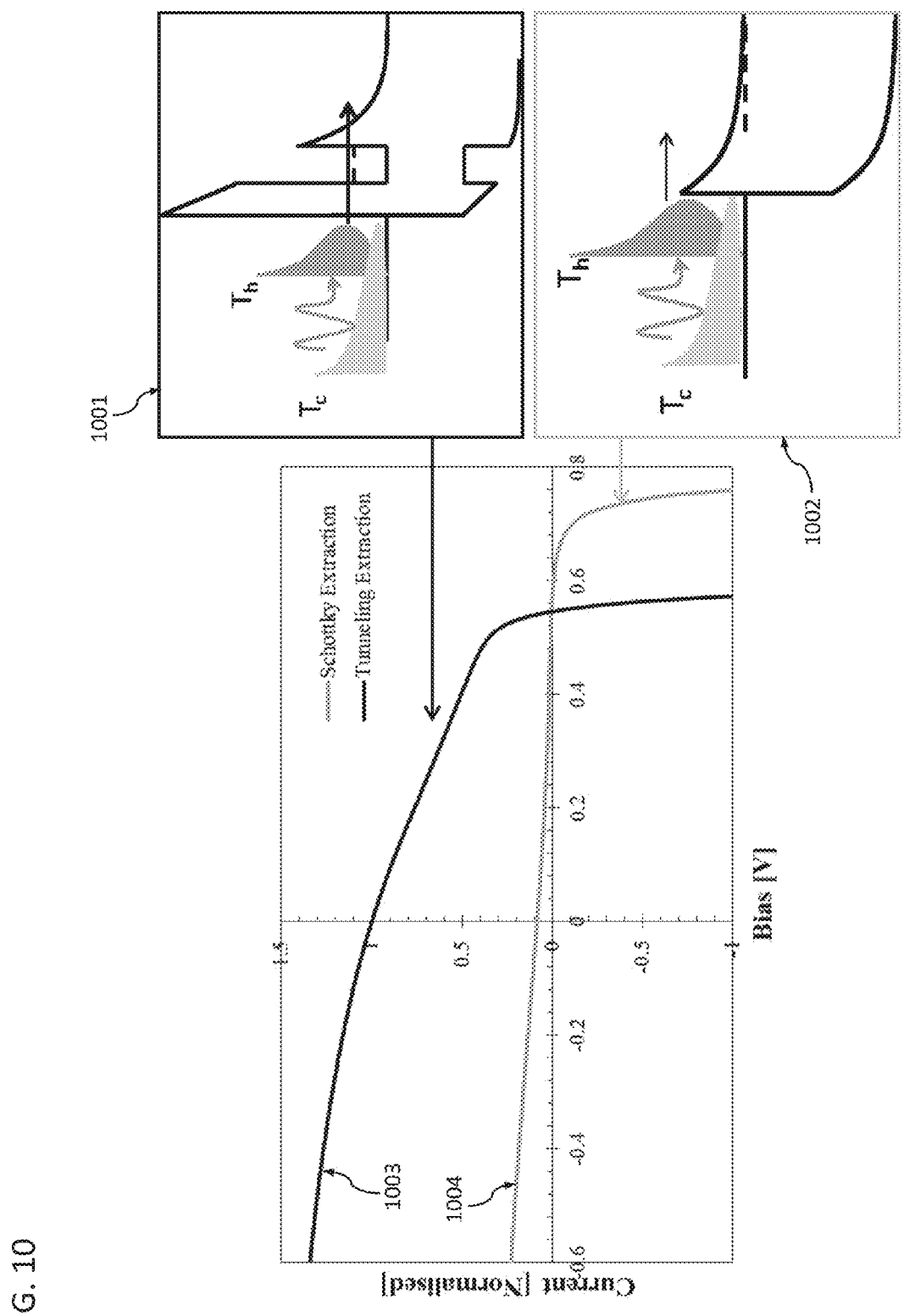
FIG. 10 shows the normalised output current for a device such as that of FIG. 9 compared with a standard Schottky device.

The normalised output current for such a device compared with a standard Schottky device (realised in $n-Al_{0.4}Ga_{0.6}As$ with the same thickness Cr layer) is shown in FIG. 10, revealing an order of magnitude increase in current for the tunneling extraction structure (1001 and 1003) compared with the Schottky extraction structure (1002 and 1004).

Embodiment 7

Figure 11:
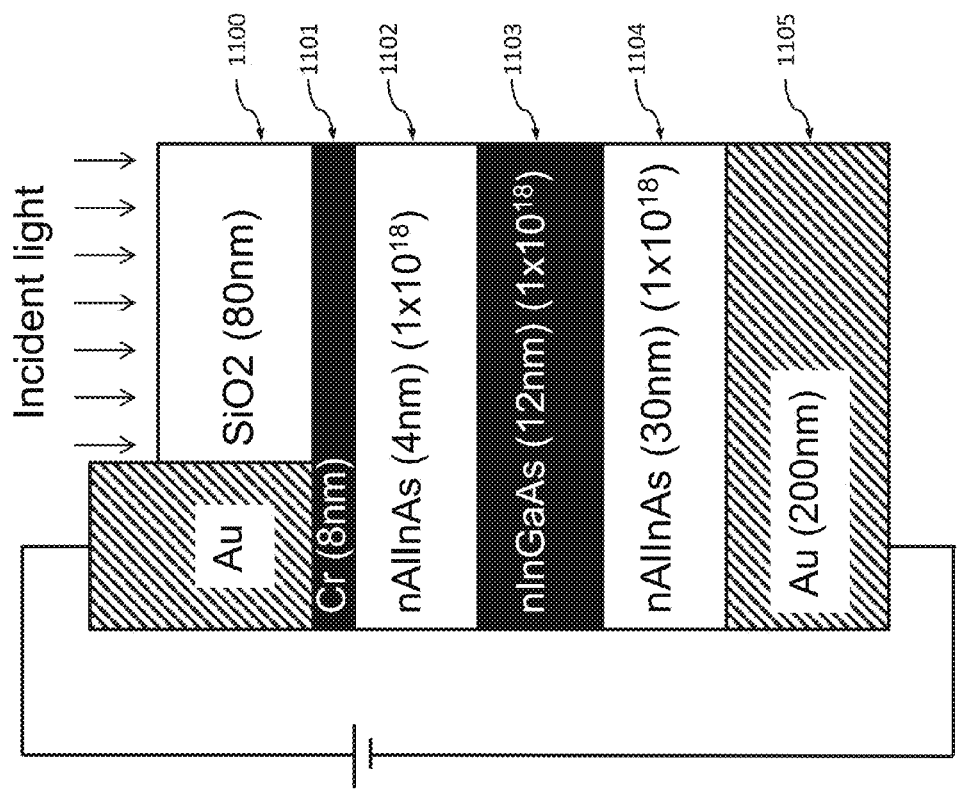
FIG. 11. shows a schematic illustration of the layer structure of a device realised in AlInAs/InGaAs with a Chromium metallic absorber layer FIG. 12. shows the reflection of the layer structure detailed in FIG. 11 as a function of wavelength of illumination, FIG. 13. shows a schematic representation of the conduction band (1300) and valence band (1301) structure of the Cr/AlInAs/InGaAs structure

A further embodiment of the device in a particular materials system is shown in FIG. 11, in the InGaAs/AlInAs materials system. This and the AlGaAs/GaAs embodiment are two example materials systems, but many other semiconductor materials systems exist for which similar band structures could be created, such as but not limited to InGaAs/GaAs/AlGaAs, InGaSb/GaSb/AlGaSb, GaInP/GaAs, InGaN/GaN/AlGaN, Si/Ge/Sn and InGaAs/InAlAs/InP.

Figure 12:
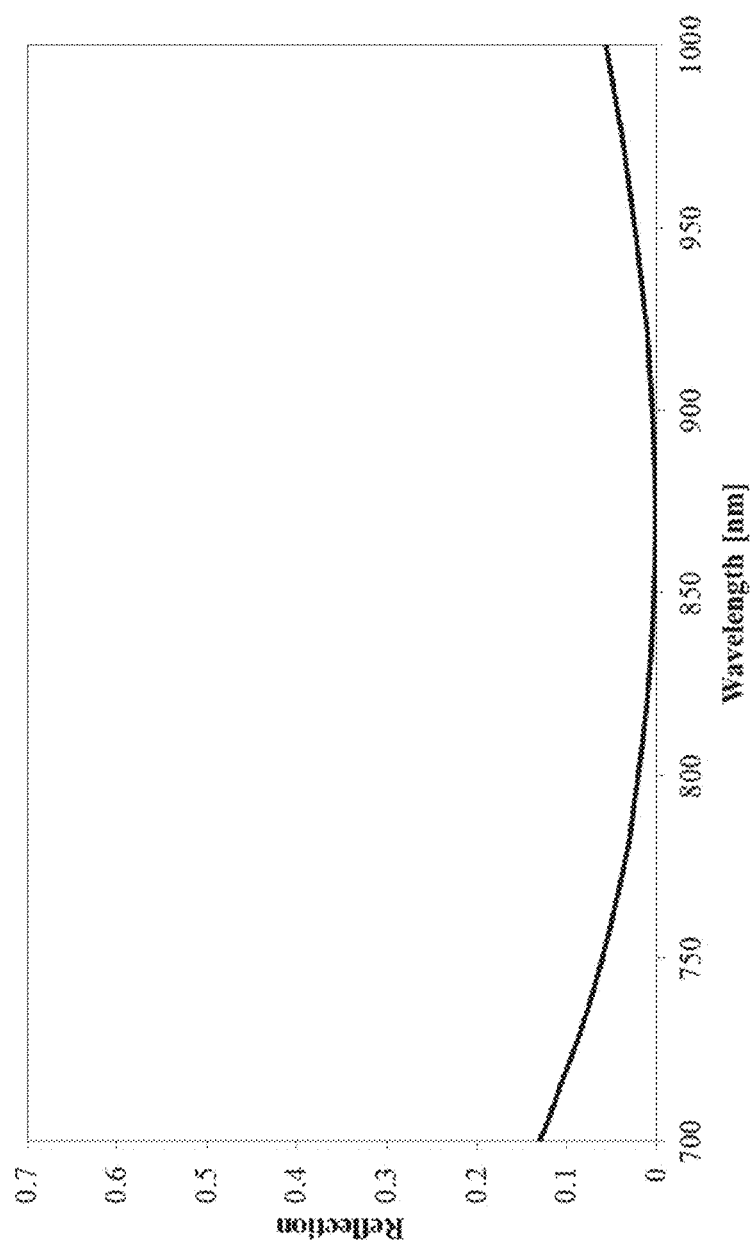

In FIG. 11, an optimised layer stack of an SiO2 anti-reflection coating (1100) is disposed on a Chromium metallic absorber (1101) with tunneling extraction provided by a series of layers of nAlInAs (1102), nInGaAs (1103), and nAlInAs (1104) on a gold reflector and contact (1105). This stack has the reflection profile shown in FIG. 12, which shows the reflection of the layer structure detailed in FIG. 11 as a function of wavelength of illumination, whereby the absorption into the Cr layer is greater than 90% across this wavelength range.

Figure 13:
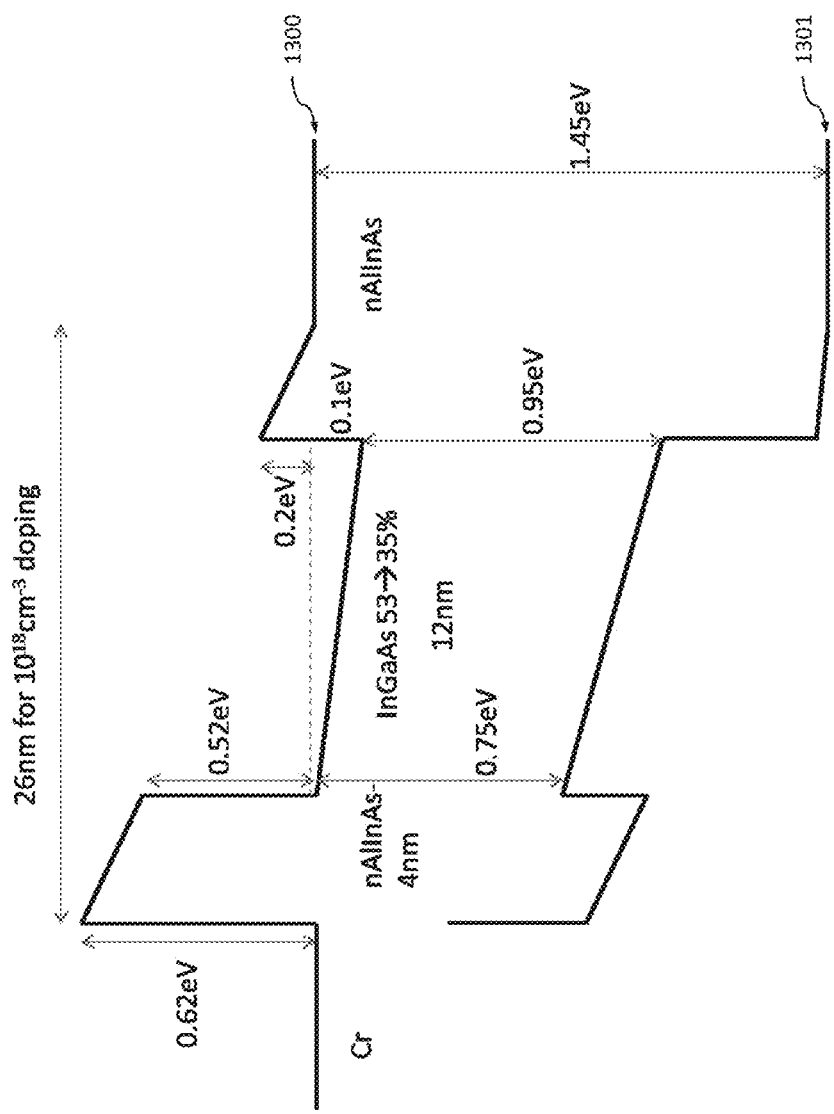

FIG. 13. shows the conduction band (1300) and valence band (1301) profiles of this structure showing its compatibility with the device operation already proposed for the tunneling extraction photovoltaic or photodetector device.

As aspect of the invention is a semiconductor device with a layer structure. In exemplary embodiments, the semiconductor device may include a metallic layer of a thickness 1-100 nm, with a thickness optimised to absorb light in a wavelength range of operation; an adjacent semiconductor layer additionally adjacent to an ohmic electrical contact, wherein an interface between the metallic layer and the semiconductor layer is electrically rectifying and energy selective; and the semiconductor layer includes a quantum well adjacent to the metallic layer, wherein the energy selectivity is provided by the quantum well allowing charge carrier tunneling from the metallic layer. Embodiments of the semiconductor device may include one or more of the following features, either individually or in combination.

In an exemplary embodiment of the semiconductor device, the semiconductor device further may include a reflective back surface positioned opposite to the semiconductor layer relative to incident light providing broadband reflection in the wavelength range of operation.

In an exemplary embodiment of the semiconductor device, an additional anti-reflection dielectric layer is deposited on the metallic layer, and the anti-reflection dielectric layer is configured to minimise reflection of light in the wavelength range of operation.

In an exemplary embodiment of the semiconductor device, a thickness of the anti-reflection dielectric layer and a thickness of the semiconductor layer are optimised such that light reflecting off each of the anti-reflection dielectric layer and the semiconductor layer destructively interferes.

In an exemplary embodiment of the semiconductor device, the thickness of the antireflection dielectric layer and the thickness of the semiconductor layer is substantially equal to one quarter of the wavelength of light in those layers.

In an exemplary embodiment of the semiconductor device, the metallic layer thickness is optimised such that in the absence of any other layers the metallic layer would transmit 50% of the incident light in the wavelength range of operation.

In an exemplary embodiment of the semiconductor device, a thickness of the metallic layer is less than a mean free path of a photoexcited electron in the metallic layer in the wavelength range of operation.

In an exemplary embodiment of the semiconductor device, the metallic layer acts as a front electrical contact.

In an exemplary embodiment of the semiconductor device, the metallic layer has a grating configured for enhancing plasmonic absorption.

In an exemplary embodiment of the semiconductor device, the energy selectivity is such that the transmission of electrons from the metallic layer occurs over an energy width of less than 0.5 eV.

In an exemplary embodiment of the semiconductor device, a refractive index and extinction coefficient of the metallic layer is between 3-4 in the wavelength range of operation.

In an exemplary embodiment of the semiconductor device, the metallic layer is any one of Chromium, Bismuth or Molybdenum.

In an exemplary embodiment of the semiconductor device, the metallic layer comprises a plurality of metal layers including a first metallic layer deposited on the semiconductor layer.

In an exemplary embodiment of the semiconductor device, the anti-reflection dielectric layer comprises a plurality of anti-reflection coating layers.

In an exemplary embodiment of the semiconductor device, the semiconductor layer comprises a plurality of layers and one of the layers is the quantum well.

In an exemplary embodiment of the semiconductor device, the semiconductor layer is grown or etched to be configured as nanowires or nanofins in a direction perpendicular to a growth direction with a dielectric medium disposed between adjacent nanowires or nanofins.

In an exemplary embodiment of the semiconductor device, the quantum well is provided by a GaAs layer disposed between two AlGaAs layers.

In an exemplary embodiment of the semiconductor device, the quantum well is provided by an InGaAs layer disposed between two AlInAs layers.

In an exemplary embodiment of the semiconductor device, the semiconductor device is configured to extract carriers against an external resistance so as to convert optical energy in to electrical energy.

In an exemplary embodiment of the semiconductor device, the semiconductor device further may include a bias voltage source that applies an external bias, wherein carriers are extracted with the assistance of the external bias so as to operate the semiconductor device as a photodetector.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The invention finds application in photodetection and energy conversion. This device may be used as an efficient photodetector for a very wide range of wavelengths, tuned by altering the tunneling energy. It may also be used as an efficient photovoltaic cell, converting broadband incident light into electrical energy. Owing to its particular novelty at detecting and converting light with long wavelengths, this device may also be used as an efficient photovoltaic cell in a thermophotovoltaic set up.

What is claimed is:

1. A semiconductor device with a layer structure comprising:
   a metallic layer of a thickness 1-100 nm, with a thickness optimised to absorb light in a wavelength range of operation;
   an adjacent semiconductor layer additionally adjacent to an ohmic electrical contact, wherein an interface between the metallic layer and the semiconductor layer is electrically rectifying and energy selective; and
   the semiconductor layer includes a quantum well adjacent to the metallic layer, wherein the energy selectivity is provided by the quantum well allowing charge carrier tunneling from the metallic layer.

2. The semiconductor device of claim 1, further comprising a reflective back surface positioned opposite to the semiconductor layer relative to incident light providing broadband reflection in the wavelength range of operation.

3. The semiconductor device of claim 1, wherein an additional anti-reflection dielectric layer is deposited on the metallic layer, and the anti-reflection dielectric layer is configured to minimise reflection of light in the wavelength range of operation.

4. The semiconductor device of claim 3, wherein a thickness of the anti-reflection dielectric layer and a thickness of the semiconductor layer are optimised such that light reflecting off each of the anti-reflection dielectric layer and the semiconductor layer destructively interferes.

5. The semiconductor device of claim 4, wherein the thickness of the antireflection dielectric layer and the thickness of the semiconductor layer is substantially equal to one quarter of the wavelength of light in those layers.

6. The semiconductor device of claim 1, wherein the metallic layer thickness is optimised such that in the absence of any other layers the metallic layer would transmit 50% of the incident light in the wavelength range of operation.

7. The semiconductor device of claim 1, wherein a thickness of the metallic layer is less than a mean free path of a photoexcited electron in the metallic layer in the wavelength range of operation.

8. The semiconductor device of claim 1, wherein the metallic layer acts as a front electrical contact.

9. The semiconductor device of claim 1, wherein the metallic layer has a grating configured for enhancing plasmonic absorption.

10. The semiconductor device of claim 1, wherein the energy selectivity is such that the transmission of electrons from the metallic layer occurs over an energy width of less than 0.5 eV.

11. The semiconductor device of claim 1, wherein a refractive index and extinction coefficient of the metallic layer is between 3-4 in the wavelength range of operation.

12. The semiconductor device of claim 1, wherein the metallic layer is any one of Chromium, Bismuth or Molybdenum.

13. The semiconductor device of claim 1, wherein the metallic layer comprises a plurality of metal layers including a first metallic layer deposited on the semiconductor layer.

14. The semiconductor device of claim 1, wherein the anti-reflection dielectric layer comprises a plurality of anti-reflection coating layers.

15. The semiconductor device of claim 1, wherein the semiconductor layer comprises a plurality of layers and one of the layers is the quantum well.

16. The semiconductor device of claim 1, wherein the semiconductor layer is grown or etched to be configured as nanowires or nanofins in a direction perpendicular to a growth direction with a dielectric medium disposed between adjacent nanowires or nanofins.

17. The semiconductor device of claim 1, wherein the quantum well is provided by a GaAs layer disposed between two AlGaAs layers.

18. The semiconductor device of claim 1, wherein the quantum well is provided by an InGaAs layer disposed between two AlInAs layers.

19. The semiconductor device of claim 1, wherein the semiconductor device is configured to extract carriers against an external resistance so as to convert optical energy in to electrical energy.

20. The semiconductor device of claim 1, further comprising a bias voltage source that applies an external bias, wherein carriers are extracted with the assistance of the external bias so as to operate the semiconductor device as a photodetector.

* * * * *